US008595678B2

(12) United States Patent (10) Patent No.: US 8,595,678 B2
Monroe et al. (45) Date of Patent: Nov. 26, 2013

(54) VALIDATING INTERCONNECTIONS BETWEEN LOGIC BLOCKS IN A CIRCUIT DESCRIPTION

(75) Inventors: Craig M. Monroe, South Burlington, VT (US); Michael R. Ouellette, Westford, VT (US); Douglas E. Sprague, Ellsworth, ME (US); Michael A. Ziegerhofer, Jeffersonville, VT (US)

(73) Assignee: International Business Machines Corporation, Armonk, NY (US)

( * ) Notice: Subject to any disclaimer, the term of this patent is extended or adjusted under 35 U.S.C. 154(b) by 111 days.

(21) Appl. No.: 13/365,370

(22) Filed: Feb. 3, 2012

(65) Prior Publication Data

US 2013/0205268 A1 Aug. 8, 2013

(51) Int. Cl.
*G06F 17/50* (2006.01)
(52) U.S. Cl.
USPC ............ 716/136; 716/106; 716/111; 716/116
(58) Field of Classification Search
USPC .................. 716/106–111, 116–117, 136–138
See application file for complete search history.

(56) References Cited

U.S. PATENT DOCUMENTS

| 6,505,317 | B1 | 1/2003 | Smith et al. |
| 6,678,875 | B2 | 1/2004 | Pajak et al. |
| 7,103,860 | B2 | 9/2006 | Price et al. |
| 7,536,267 | B2 | 5/2009 | Zimmerman et al. |
| 2003/0149949 | A1 * | 8/2003 | Price et al. ................. 716/4 |
| 2005/0080581 | A1 | 4/2005 | Zimmerman et al. |
| 2005/0273683 | A1 | 12/2005 | Cote et al. |
| 2006/0080058 | A1 | 4/2006 | Zimmerman et al. |

FOREIGN PATENT DOCUMENTS

| EP | 1266236 B1 | 9/2003 |
| WO | 0173459 A2 | 10/2001 |
| WO | 0173459 A3 | 10/2001 |

OTHER PUBLICATIONS

Corelis, "Boundary-Scan for PCB Interconnect Testing and In-System Programming of CPLDs and Flash Memories", Cerritos, CA, Whitepaper [online], [retrieved on Dec. 10, 2011]. Retrieved from the internet<URL: http://www.corelis.com/whitepapers/Boundary-Scan_Whitepaper.pdf>.
Hlawiczka et al. "Testing of Crosstalk-type Dynamic Faults in Interconnection Networks with Use of Ring LFSRs", MIXDES 2009, 16th International Conference Mixed Design of Integrated Circuits & Systems, pp. 530-535, Jun. 25-27, 2009 [online], [retrieved on Jan. 20, 2012]. Retrieved from the Internet <URL: http://ieeexplore.ieee.org/stamp/stamp.jsp?tp=&arnumber=5289460>.
U.S. Appl. No. 13/080,055, entitled "Data Structure for Describing MBIST Architecture" filed Apr. 5, 2011.

* cited by examiner

*Primary Examiner* — Paul Dinh
(74) *Attorney, Agent, or Firm* — Jason H. Sosa; David Cain

(57) ABSTRACT

Disclosed is a program for creating a checking-statement which can be subsequently used to validate interconnections between logic blocks in a circuit design. The checking-statement is created by taking a description of how logic blocks in a circuit design are associated to one another (if at all), and cross referencing the description with rule statements specific to each logic block defining the allowable connections between the specific logic block and other logic blocks.

20 Claims, 7 Drawing Sheets

```
# Org title - Chip_Top

# Element / Cell Name
# (plus prefix tokens)

       top_ret=Chip_Top
110 — ccecid WRAP_CC_ECID_T09
108 — fcntl WRAP_FUSECNTL_T09
112 — bcntl BISTCNTL T09
114 — bist BIST1D
          mem WRAP_SRAM1 DWxxxxxByyyDddss
          mem WRAP_SRAM1 DWxxxxxByyyDddss
114 — bist BIST2R
          mem WRAP_SRAM2RWxxxxxByyyDddss
          mem WRAP SRAM2RWxxxxxByyyDddss
112 — bcntl BISTCNTL T09
114 — bist BIST1S
          mem WRAP_SRAM1SWxxxxxByyyDddss
          mem WRAP SRAM1SWxxxxxByyyDddss
114 — bist BIST3P
          mem WRAP_SRAM3PWxxxxxByyyDddss
          mem WRAP_SRAM3PWxxxxxByyyDddss
108 — fcntl WRAP_FUSECNTL_T09
112 — bcntl BISTCNTL T09
114 — bist BIST2R
          mem WRAP_SRAM2RWxxxxxByyyDddss
          mem WRAP_SRAM2RWxxxxxByyyDddss
114 — bist BIST4P
          mem WRAP_SRAM4PWxxxxxByyyDddss
          mem WRAP_SRAM4PWxxxxxByyyDddss
       end_top_ret
```

| Hierarchical Instance Name (Relative to current block) | Clock Source Instance/Pin and Phase (+/−) | Parameter Values |
|---|---|---|
| FC1 | . | . |
| FC2 | . | . |
| BC1 | . | . |
| W11_1_BIST1 D | . | WRAPPER_NUM_BAYS=3 |
| W11_1 | . | . |
| W11_2 | . | . |
| W12_1_BIST2R | . | . |
| W12_1 | . | . |
| W12_2 | . | . |
| BC2 | . | . |
| W21_1_BIST1S | . | . |
| W21_1 | . | . |
| W21_2 | . | . |
| W22_1_BIST3P | . | . |
| W22_1 | . | . |
| W22_2 | . | . |
| FC3 | . | . |
| BC3 | . | . |
| W31_1_BIST2R | . | WRAPPER_NUM_BAYS=2 |
| W31_1 | . | . |
| W31_2 | . | . |
| W 32_1_BIST4P | . | . |
| W32_1 | . | . |
| W32_2 | . | . |

| Element / Cell Name (plus prefix tokens) | Hierarchical Instance Name (Relative to current block) | Clock Source Instance/Pin and Phase (+/-) | Parameter Values |
|---|---|---|---|
| # Org file - BlockA | | | |
| # | | | |
| # | | | |
| # | | | |
| hier_ref=Block1 | | | |
| view=WRAP_FUSECNTL_REF1 | | | |
| bcntl BISTCNTLT09 | BC1 | . . . | . . . . . . . |
|   bist BIST1D | W11_1_BIST1D | . . . | |
|     mem WRAP_SRAM1DWxxxxxByyyDddss | W11_1 | . . . | |
|     mem WRAP_SRAM1DWxxxxxByyyDddss | W11_2 | | |
|   bist BIST2R | W12_1_BIST2R | | |
|     mem WRAP_SRAM2RWxxxxxByyyDddss | W12_1 | | |
|     mem WRAP_SRAM2RWxxxxxByyyDddss | W12_2 | | |
| end_view | | | |
| end_hier_ref | | | |

BIST1D from-to statements

```
connection_choice
mb_assert_path -from {   <assocBISTCNTLinst>.BC_CNTL | \
        BC_CNTL_BISTCNTL_<assocBISTCNTLview> } \
    -to <thisBISTinst>.BC_CNTL \
    -path_type buffered -no_invert -parallel
end_connection_choice previous_connection_choice
mb_assert_path -from {   <previousBISTinst>.BC_DAISY_OUT | \
        <assocBISTCNTLinst>.BC_DAISY_OUT | \
        BC_DAISY_OUT_BISTCNTL_<assocBISTCNTLview> } \
    -to <thisBISTinst>.BC_DAISY_IN \
    -path_type buffered -no_invert -parallel
end_previous_connection_choice connection_choice
mb_assert_path -from {   <assocECIDinst>.CC_CNTLCLK_OUT | \
        CC_CNTLCLK_OUT_WRAP_CC_ECID_<assocBISTCNTLview> | \
        CC_CNTLCLK_OUT_WRAP_CC_ECID_<assocFUSECNTLview> | \
        CC_CNTLCLK_OUT_WRAP_CC_ECID_<assocECIDview> } \
    -to <thisBISTinst>.CC_CNTLCLK \
    -path_type buffered -no_invert -parallel
end_connection_choice mb_assert_path -from <assocMEMinst_00>.INTWRAP.SBIO.BI_RETURN[2:0] \
    -to <thisBISTinst>.BI_RETURN[2:0] \
    -path_type buffered -no_invert -parallel connection_choice
mb_assert_path -from {<assocMEMinst_01>.INTWRAP.SBIO.BI_RETURN[2:0] | \
        GND } \
    -to <thisBISTinst>.BI_RETURN[7:5] \
    -path_type buffered -no_invert -parallel
end_connection_choice
```

502

---

BISTCNTL From-To Statements

```
connection_choice
mb_assert_path -from {   <assocFUSECNTLinst>.FC_CNTL | \
        FC_CNTL_WRAP_FUSECNTL_<assocFUSECNTLview> } \
    -to <thisBISTCNTLinst>.FC_CNTL \
    -path_type buffered -no_invert -parallel
end_connection_choice last_connection_choice
mb_assert_path -from {   <lastBISTinst>.BC_DAISY_OUT | \
        <lastBCMODinst>.BC_DAISY_IN_BISTCNTL_<lastBCMODref> } \
    -to <thisBISTCNTLinst>.BC_DAISY_IN \
    -path_type buffered -no_invert -parallel
end_last_connection_choice

# DIAG Tree to BISTCNTL
mb_assert_function -function_type OR \
    -from { <eachassocBISTinst>.DIAG \
        <eachassocBCMODinst>.DIAGTREE_BISTCNTL_<eachassocBCMODref> } \
    -to <thisBISTCNTLinst>.DIAGTREE \
    -check_type structural
```

VALIDATING INTERCONNECTIONS BETWEEN LOGIC BLOCKS IN A CIRCUIT DESCRIPTION

FIELD OF THE INVENTION

The present invention relates generally to integrated circuit design and more particularly to validation of interconnections between inserted logic structures in a design architecture arrangement.

BACKGROUND OF THE INVENTION

In electronic design, a predesigned semiconductor logic block (also referred to as an intellectual property core, IP core, or IP block) is a reusable unit of logic, cell, or chip layout design. The "IP" term is derived from patent and source code copyright intellectual property rights that often subsist in the design. IP blocks can be used as building blocks within ASIC (application-specific integrated circuit) chip designs or FPGA (field-programmable gate array) logic designs.

The logic in an IP block may be defined in a register transfer language (RTL) or, alternatively, may be offered as generic gate-level netlists. Subsequent to creation, the IP block is often stored in a library of IP blocks that a developer may insert into a circuit description of a circuit under development.

As integrated circuits continue to become increasingly more complex, it is becoming increasingly more important to embed built-in self tests (BISTs) into a circuit which can be used during design and after manufacture to test the circuit and its various sub-circuits and components. A BIST is often designed as an IP block (BIST IP block) and may be inserted into a circuit description as specified by a designer. The positioning of BIST IP blocks within a circuit description may be referred to herein as the BIST architecture.

A developer may construct chip logic designs as separate design modules, each design module containing a portion of the chip logic and may include one or more IP blocks, including BIST IP blocks. These separate design modules may then be integrated into higher level design modules, forming a design hierarchy, until all design modules are represented in the overall chip design.

SUMMARY

Aspects of an embodiment of the present invention disclose a method, program product, and system for producing an interconnection checking statement for validating an interconnection between logic block instances. The method comprises a computer receiving a description of a first logic block instance, a second logic block instance, and an association between the first logic block instance and the second logic block instance in a circuit design, wherein the first and second logic block instances are each selected from a plurality of logic block designs. The method further comprises the computer locating a rule statement associated with a first logic block design from the plurality of logic block designs and corresponding to the first logic block instance, the rule statement defining an output of at least a second logic block design, from the plurality of logic block designs, as a valid connection source to an input of the first logic block design. The method further comprises the computer determining whether the second logic block instance in the description connects to the first logic block instance in the description by examining the association between the first and second logic block instances. The method further comprises the computer determining whether the second logic block design corresponds to the second logic block instance. The method further comprises, responsive to determining that the second logic block instance connects to the first logic block instance and that the second logic block design corresponds to the second logic block instance, the computer creating an interconnection checking statement asserting an interconnection between an output of the second logic block instance corresponding to the output of the second logic block design, and an input of the first logic block instance corresponding to the input of the first logic block design.

BRIEF DESCRIPTION OF THE SEVERAL VIEWS OF THE DRAWINGS

FIG. 1 illustrates an exemplary organizational file describing a particular BIST architectural arrangement, in accordance with an embodiment of the present invention.

FIG. 4 depicts an exemplary organizational file describing the separate module of FIG. 3, in accordance with an embodiment of the present invention.

FIG. 5 depicts exemplary from-to rules, in accordance with an embodiment of the present invention.

DETAILED DESCRIPTION

Figure 2:
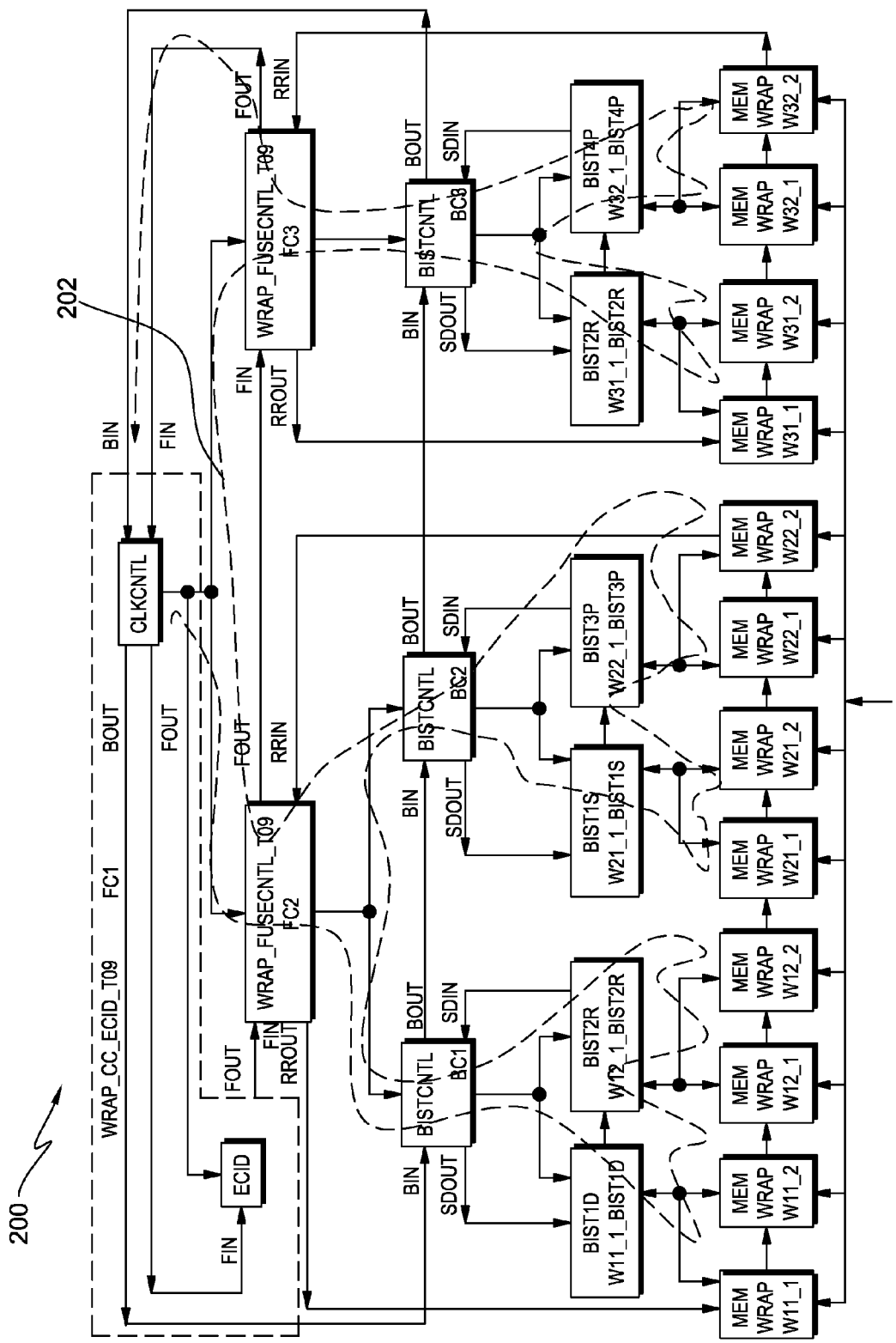
FIG. 2 illustrates a BIST architecture with IP blocks inserted as described by the organizational file of FIG. 1.

Embodiments of the present invention recognize that it is desirable to validate the interconnections between BIST IP blocks in a BIST architecture. "Validate" is used to describe the process of ensuring that interconnections described in a BIST architecture are correctly used in the resulting chip design. Given a "checking" statement that asserts that a connection should exist between a specific pin of a specific source IP block and a specific pin of specific destination IP block, methods exists to verify the interconnection. Embodiments of the present invention provide a means to efficiently create thousands, or even hundreds of thousands, of such "checking" statements by comparing an organizational file, describing associations between the BIST IP blocks in a BIST architecture, and rules regarding the operability of specific BIST IP blocks. Though discussion herein focuses on validating the interconnections of BIST IP blocks as the preferred embodiment, it will be understood by those of ordinary skill in the art that the concepts described are applicable to all forms of IP blocks. The present invention will now be described in detail with reference to the Figures.

FIG. 1 illustrates an exemplary organizational file 100 describing a particular BIST architectural arrangement, in accordance with an embodiment of the present invention. From organizational file 100, associations between IP blocks in the BIST architecture, such as order, hierarchy, parent-child relationships, etc., can be derived. A method for creating and using such an organizational file is described in IBM® patent application Ser. No. 13/080,055, entitled "Data Structure for Describing MBIST Architecture," herein incorporated by reference.

Within organizational file 100, column 102 lists selected IP blocks in an arrangement that shows the parent/child/sibling relationship between the blocks. Each selected IP block is identified by the type of block it is (e.g., a BIST control block is shown as type "bcnt1"), and the name of the IP block (e.g., bist BIST1D refers to a BIST engine with the name of BIST1D). Column 104 gives each inserted block a name for that particular instance of use. As depicted, fuse control blocks 108 are children of clock control block 110. Two BIST control blocks 112 are children of the first of fuse control blocks 108 and one BIST control block 112 is the child of the second of fuse control blocks 108. Each respective BIST control block 112 controls (is the parent of) one or more BIST engines 114, which in turn, are responsible for testing one or more memory wrappers. Each of these IP blocks may be selected from a set of IP blocks stored within a library and may be used as needed. Certain IP blocks may be used in multiple instances. The instance name of each of the IP blocks placed in the BIST architecture as described by organizational file 100, is listed in column 104.

The order in which the IP blocks are listed also dictates the daisy chain order of the IP blocks. A parent IP block connects to its first listed child followed by its second listed child and each subsequently listed child. The first listed child IP block, in turn, connects to its own children as sequentially depicted. As shown, clock control block FC1 passes connects to fuse control block FC2, which connects to BIST control block BC1, which connects to BIST engine W11_1_BIST1D, which tests memory wrapper W11_1 followed by memory wrapper W11_2. Subsequent to connecting to BIST engine W11_1_BIST1D, BIST control block BC1 connects to its next child, BIST engine W12_1_BIST2R. This order continues through every IP block in a given description.

A person of ordinary skill in the art will understand that organizational file 100 may describe these relationships in a variety of ways.

FIG. 2 illustrates BIST architecture 200 with IP blocks inserted as described by organizational file 100. The instances of the inserted IP blocks are shown in their parent/child relationship hierarchy. The interconnections formed between the inserted IP blocks are also depicted and include the direction of the connections. It is these interconnections that embodiments of the present invention test by subsequently creating "checking" statements. Daisy chain 202 shows the sequential order of connections from one IP block to the next.

As described briefly in the background, within a design hierarchy, one or more IP blocks may be formed into a design module, which may be created separately and inserted into a higher level design logic. When designing modularly, the developer of the module cannot describe the relationship between the IP blocks within the module and IP blocks of the higher level design, as the design module may be inserted in various locations of a circuit description (one of the many benefits of modular design). Similarly, when developing the higher level design, the design cannot "see" the components/IP blocks within the module.

Figure 3:
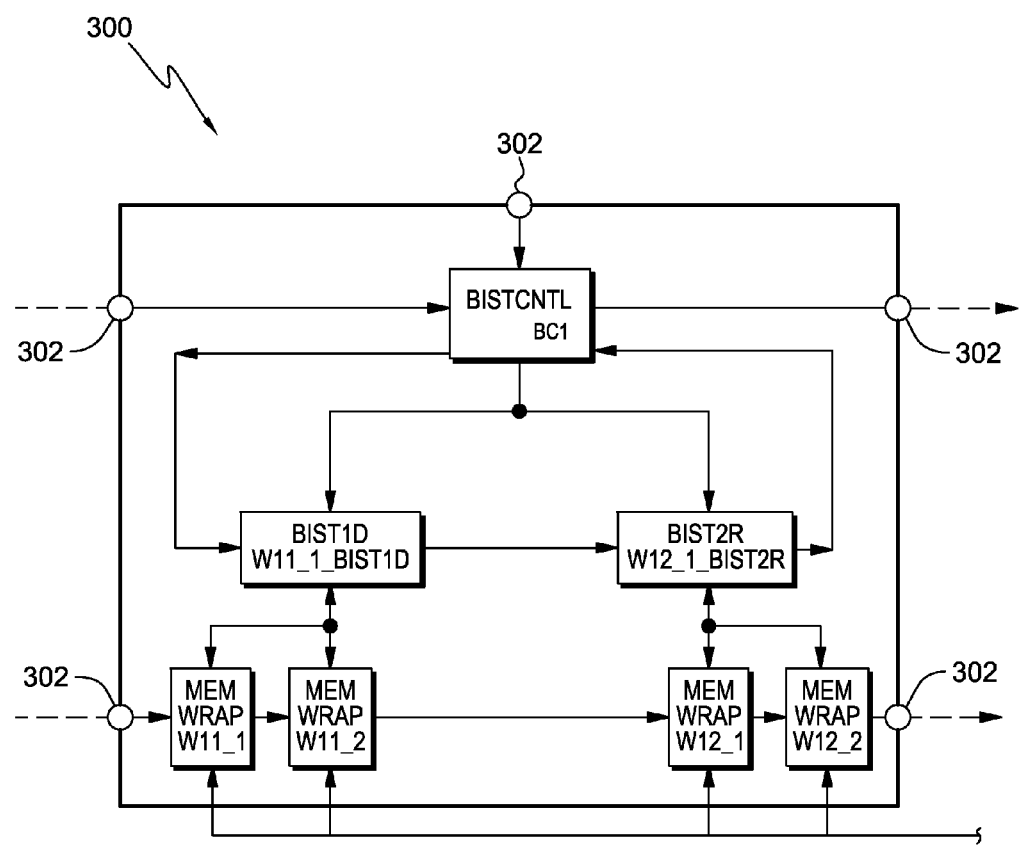
FIG. 3 depicts an embodiment where certain IP blocks of FIG. 2 have been designed as a separate module and inserted into the BIST architecture of FIG. 2.

FIG. 3 depicts an embodiment where BIST control block BC1 and BIST engines W11_1_BIST1D and W12_1_BIST2R of FIG. 2 have been designed as a separate module, design module 300, and inserted into BIST architecture 200. Because external connecting IP blocks are "unknown" from within design module 300, when describing the BIST architecture of design module 300 in an organization file, a set of test ports 302 (also referred to as the "view") may be added to account for input from sources external to design module 300 and output from design module 300. Similarly, the higher level BIST architecture is described with reference to the set of test ports 302. When referencing the "view" from outside design module 300, test ports 302 are referred to as a "reference." In a preferred embodiment, an organizational file describes interconnection to test ports 302 (both from within the description of design module 300 and from the higher level design referring to design module 300), to allow for interconnection checking throughout the design hierarchy.

FIG. 4 depicts an exemplary organizational file, organizational file 400, describing design module 300 in accordance with an embodiment of the present invention. The "view" construct is used to create/describe test ports 302 within design module 300. An "IP block," as used herein, may include a set of test ports.

Embodiments of the present invention contemplate that, with each IP block saved in a library, at least one rule is associated with the IP block. In a preferred embodiment, each rule is a file specific to the specified IP block. Each rule provides a plurality of statements that describe an input pin of the IP block, and defines at least one allowable source for the input pin. An allowable source is any IP block and respective output pin of the allowable IP block that may communicate with the input pin. For example, an IP block of type A may be generally allowed to receive a communication at a first input pin from a specific output pin of an IP block of type B, or from a specific output pin of an IP block of type C, or even from a specific output pin of another instance of an IP block of type A. Each possible connection is represented by a rule statement. These rules may be referred to herein as "from-to" rules. In a preferred embodiment, each view type and reference type will also support from-to rules. A person of skill in the art will recognize that specific input pins and output pins may actually be represented by corresponding input and output buses.

FIG. 5 depicts exemplary from-to rules 500, in accordance with an embodiment of the present invention.

As seen in organizational file 100 from FIG. 1 and from organizational file 400 from FIG. 4, one BIST engine used in these examples is the BIST engine BIST1D, which would be found in a library of BIST IP blocks. From-to rule 502 contains a list of from-to statements describing the input pins of BIST1D and the possible sources connecting to those pins. The list of statements shown is only a select few of the possible from-to statements. Similarly, from-to rule 504 contains a list of from-to statements describing the input pins of BIST IP block "BISTCNTL," and the possible sources connecting to those pins.

To create the desired interconnection checking statements, embodiments of the present invention compare an organizational file describing the desired BIST architecture (e.g., organizational file 100 or organizational file 400) to applicable from-to rules, and in response, determine instance-specific checking statements that may be used to validate interconnections described within the BIST architecture.

Figure 6:
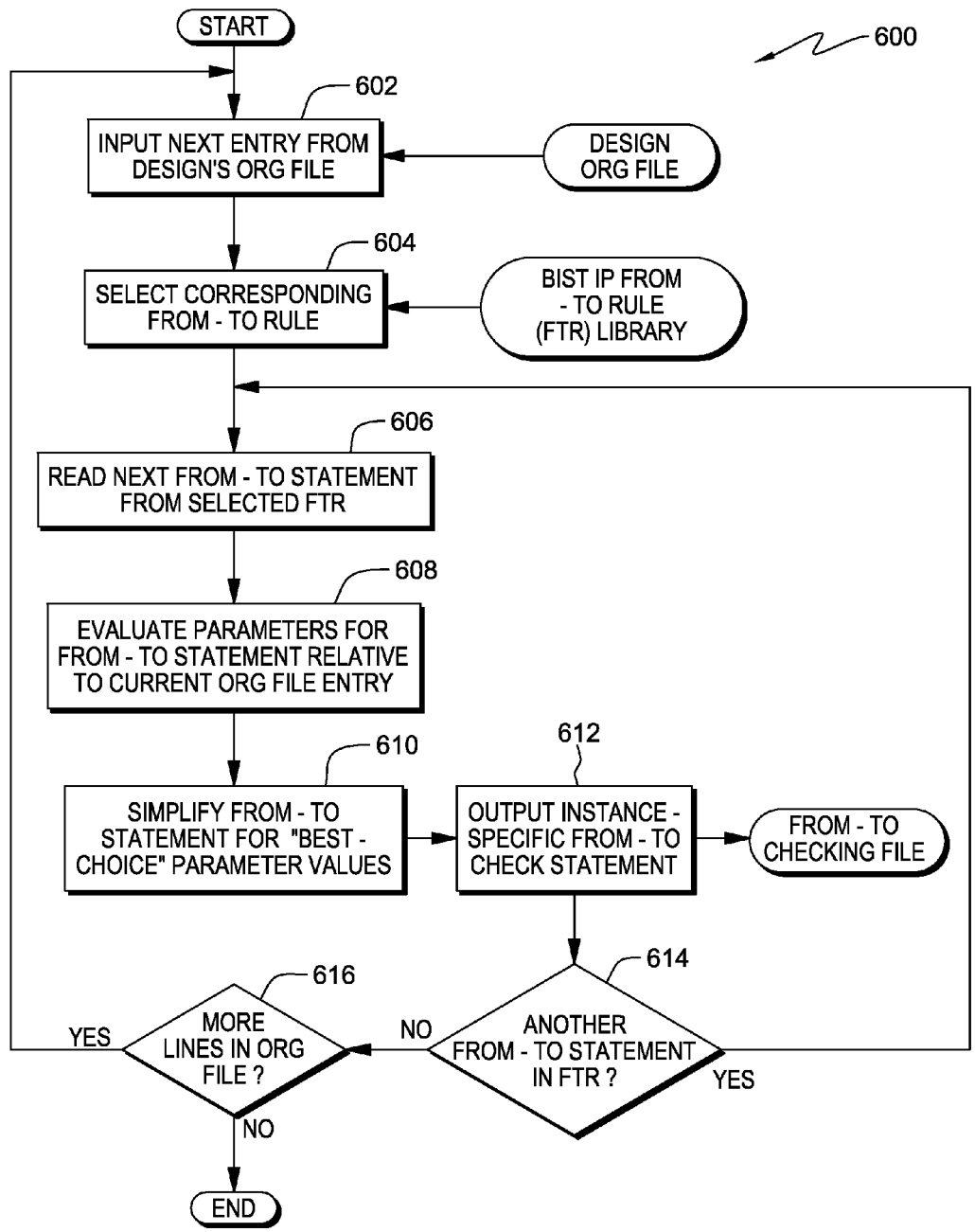
FIG. 6 depicts the steps of a checking-statement generating program, in accordance with an embodiment of the present invention.

FIG. 6 depicts the steps of a checking-statement generating program, program 600, in accordance with an embodiment of the present invention. Program 600 receives an organizational file and reads the first entry from the organizational file (step 602). As referred to herein, an entry is a line of the organizational file containing an instance of an IP block. For example, in the case of organizational file 400, the first entry is "view=WRAP_FUSECNTL_REF1."

Program 600 selects the corresponding from-to rule (step 604). To accomplish this, program 600 parses the line and determines the BIST IP on the line, in this case, WRAP_FUSECNTL_REF1. Program 600 looks for the from-to rule associated with this reference. Subsequent to locating the from-to rule, program 600 reads the first from-to statement from the from-to rule (step 606).

Program 600 evaluates the parameters of the from-to statement relative to the current organizational file entry (step 608). The "to" in the from-to statement is an input or destination pin on the IP block identified by the current organizational file entry. Program 600 may look at lines above the current entry and below the current entry to determine if any of them meet the "from" parameter(s) of the from-to statement. Program 600 inserts the best choice into the parameters of the from-to statement (step 610) to create an instance-specific from-to checking statement (step 612). This checking statement may be saved in a file of checking statements. Program 600 determines whether there are any more from-to statements in the from-to rule (decision block 614), and if there are, returns to step 606 to read in the next from-to statement.

If there are no more from-to statements in the from-to rule, program 600 determines whether there are more entries in the organizational file (decision block 616). If there are, program 600 returns to step 602 to read in the next line of the organizational file. If there are not, program 600 ends.

To simplify, for every instance of an IP block in an organizational file, program 600 will find the applicable from-to rule, check every possible rule statement against the current architecture to determine the interconnections between the identified IP block and its surrounding IP blocks. The determined interconnections are listed as an instance-specific from-to checking statement which may be subsequently validated.

To illustrate the comparison of the from-to rules with an organizational file, organizational file 400 will be analyzed with reference to from-to rules 500. As program 600 steps through the entries of organizational file 400, the program will at some point read in the following line:
"bist BIST1D W11_1_BIST1D - - ".

Program 600 parses the line and determines that the applicable BIST IP block is "BIST1D." Program 600 searches for a from-to rule for BIST1D and finds from-to rule 502 depicted in FIG. 5.

Program 600 identifies and reads in the first from-to statement:

```
connection_choice
    mb_assert_path -from {   <assocBISTCNTLinst>.BC_CNTL | \
        BC_CNTL_BISTCNTL_<assocBISTCNTLview> } \
    -to <thisBISTinst>.BC_CNTL \
    -path_type buffered -no_invert -parallel
end_connection_choice
```

Here, the "to" pin is an input bus for a BIST control IP block (identified here as .BC_CNTL) on the current instance of BIST1D (thisBISTinst). For this "to" pin, there are multiple choices for the "from" pin (denoted by "connection_choice"). These choices include the BIST control output bus on a current instance of a BIST control IP block (<assocBISTCNTLinst>.BC_CNTL), or the BIST control output bus for a BIST control view (created test ports). The current instance of BIST1D, based on the current entry from organizational file 400, is "W11_1_BIST1D." The current instance of a BIST control connecting to W11_1_BIST1D, as determined by looking at the parent of W11_1_BIST1D, is BC1. There is no current BIST Control view, so this evaluates to "null" in the from-to statement. Thus, the evaluated from-to statement initially evaluates to:

```
connection_choice
    mb_assert_path -from {   BC1.BC_CNTL | \
        BC_CNTL_BISTCNTL_null } \
    -to W11_1_BIST1D.BC_CNTL \
    -path_type buffered -no_invert -parallel
end_connection_choice
```

Because of the "connection_choice" directive, only one "from" pin can be used, so the "null" connection is dropped. The instance-specific checking statement will now read as follows:

```
mb_assert_path -from BC1.BC_CNTL  -to
    W11_1_BIST1D.BC_CNTL
    -path_type buffered -no_invert -parallel
```

This statement asserts that a connection exists between output bus BC_CNTL of IP block BC1 and input bus BC_CNTL of IP block W11_1_BIST1D. This statement may be saved in a list of produced checking statements. The next from-to statement read in by program 600 is:

```
previous_connection_choice
    mb_assert_path -from {   <previousBISTinst>.BC_DAISY_OUT | \
        <assocBISTCNTLinst>.BC_DAISY_OUT | \
        BC_DAISY_OUT_BISTCNTL_<assocBISTCNTLview> } \
    -to <thisBISTinst>.BC_DAISY_IN \
    -path_type buffered -no_invert -parallel
end_previous_connection_choice
```

In a case where there may be multiple choices for the "from" pin and multiple parameters in the rule may evaluate to a particular value (as opposed to a "null"), directives like "first_connection_choice," "previous_connection_choice," and "last_connection_choice" may direct program 600 to generate a checking statement using the closest, most recent, or furthest connection, respectfully, in the architecture. Such directives are useful in checking daisy chain connections.

Here, the "to" pin is the BC_DAISY_IN input bus on the current BIST1D instance, and the "from" pin is the BC_DAISY_OUT output bus of either the previous BIST engine, the BIST control, or the BIST control view. When comparing the from-to statement to organizational file 400, this from-to statement initially evaluates to:

```
previous_connection_choice
    mb_assert_path -from {   null.BC_DAISY_OUT | \
        BC1.BC_DAISY_OUT | \
        BC_DAISY_OUT_BISTCNTL_null } \
    -to W11_1_BIST1D.BC_DAISY_IN \
    -path_type buffered -no_invert -parallel
end_previous_connection_choice
```

In this particular instance, there was only one previous connection, BC1. This simplifies to checking statement:

```
mb_assert_path -from BC1.BC_DAISY_OUT  -to
    W11_1_BIST1D.BC_DAISY_IN
    -path_type buffered -no_invert -parallel
```

The next from-to statement is:

```
connection_choice
mb_assert_path -from {   <assocECIDinst>.CC_CNTLCLK_OUT | \
        CC_CNTLCLK_OUT_WRAP_CC_ECID_<assocBISTCNTLview> | \
        CC_CNTLCLK_OUT_WRAP_CC_ECID_<assocFUSECNTLview> | \
        CC_CNTLCLK_OUT_WRAP_CC_ECID_<assocECIDview> } \
    -to <thisBISTinst>.CC_CNTLCLK \
    -path_type buffered -no_invert -parallel
end_connection_choice
```

This statement lists potential connections to the Clock Control input bus (CC_CNTLCLK). In the architecture description of organizational file 400, there is no control clock IP block, so the connection comes through a set of test ports (an associated view) described by organizational file 400. In organizational file 400, the associated view is a fuse control view, WRAP_FUSECNTL_REF1. The from-to statement will initially evaluate to:

```
connection_choice
mb_assert_path -from {   null.CC_CNTLCLK_OUT | \
        CC_CNTLCLK_OUT_WRAP_CC_ECID_null | \
        CC_CNTLCLK_OUT_WRAP_CC_ECID_WRAP_FUSECNTL_REF1 | \
        CC_CNTLCLK_OUT_WRAP_CC_ECID_null } \
    -to W11_1_BIST1D.CC_CNTLCLK \
    -path_type buffered -no_invert -parallel
end_connection_choice
```

The one valid connection choice is chosen, simplifying to:

```
mb_assert_path -from   CC_CNTLCLK_OUT_WRAP_CC_ECID_WRAP_FUSECNTL_REF1
-to W11_1_BIST1D.CC_CNTLCLK   -path_type buffered -no_invert -parallel
```

The next from-to statement reads as follows:

```
mb_assert_path -from
    <assocMEMinst_00>INTWRAP.SBIO.BI_RETURN[2:0] \
    -to <thisBISTinst>.BI_RETURN[2:0] \
    -path_type buffered -no_invert -parallel
```

Here the "to" pin is the BI_RETURN[2:0] input bus on the current instance of BIST1D, and the "from" pin is BI_RETURN[2:0] output bus on the first memory wrapper instance ("assocMEMinst_00"). This statement ultimately evaluates to checking statement:

```
mb_assert_path -from W11_1.INTWRAP.SBIO.BI_RETURN[2:0]
    -to W11_1_BIST1D.BI_RETURN[2:0] -path_type
    buffered -no_invert -parallel
```

The final exemplary from-to statement in the from-to rule 502 states:

```
connection_choice
mb_assert_path -from
    {<assocMEMinst_01>.INTWRAP.SBIO.BI_RETURN[2:0] | \
```

```
        GND } \
    -to <thisBISTinst>.BI_RETURN[7:5] \
    -path_type buffered -no_invert -parallel
end_connection_choice
```

This asserts a path from either return bus BI_RETURN[2:0] of a second memory instance connected to input bus BI_RETURN[7:5] of BIST engine W11_1_BIST1D, or from a ground to input bus BI_RETURN[7:5]. Where the memory wrapper does not exist, the connection between the input bus of W11_1_BIST1D and a ground will be verified. In the current instance, this from-to statement simplifies to:

```
mb_assert_path -from W11_2.INTWRAP.SBIO.BI_RETURN[2:0]
    -to W11_1_BIST1D.BI_RETURN[7:5]   -path_type buffered
    -no_invert -parallel
```

This process continues for every from-to statement, and every input pin ("to" pin) is covered by at least one of the from-to statements. Program 600 creates checking statements for every instance of every IP block in a given organizational file.

Created checking statements may be validated by directed net-tracing and without simulation. More specifically, after the checking statements have been created, the netlist for the circuit design is parsed, and an interconnect data structure is created so that frontward and backward tracing from one logic block to another can be navigated. This structure can be searched for each of the connections asserted by the created checking statements. If all of the from-to interconnects are found in the design specific netlist, then the interconnections have been validated and no simulation was necessary.

Figure 7:
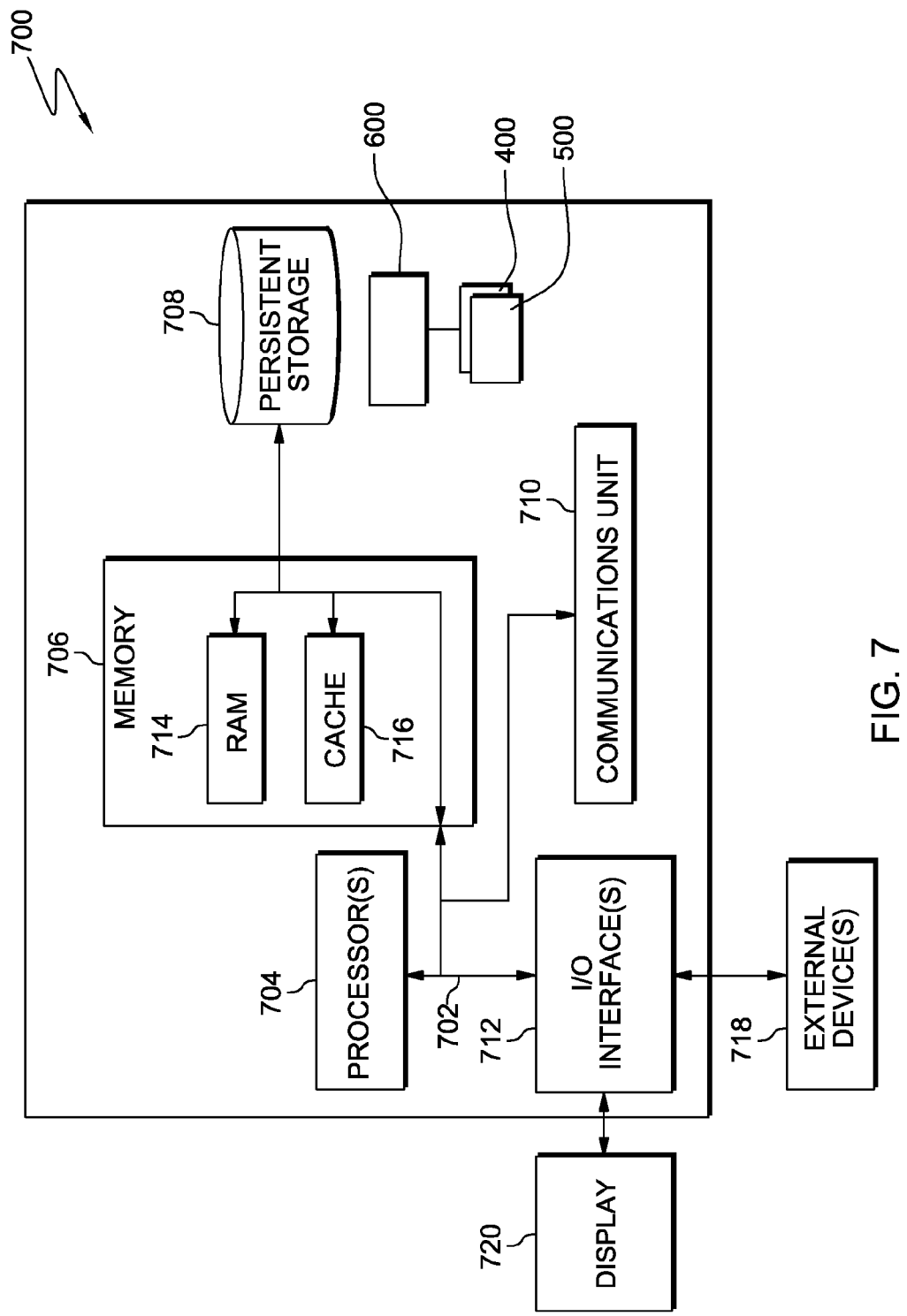
FIG. 7 depicts a block diagram of components of a computer system which stores the program of FIG. 6 and is capable of executing the program.

FIG. 7 depicts a block diagram of components of a computer system 700 which stores program 600 and is capable of executing program 600. It should be appreciated that FIG. 7 provides only an illustration of one implementation and does not imply any limitations with regard to the environment in which different embodiments may be implemented. Many modifications to the depicted environment may be made.

Computer system 700 includes communications fabric 702, which provides communications between processor(s) 704, memory 706, persistent storage 708, communications unit 710, and input/output (I/O) interface(s) 712.

Memory 706 and persistent storage 708 are examples of computer-readable tangible storage devices. A storage device is any piece of hardware that is capable of storing information, such as, data, program code in functional form, and/or other suitable information on a temporary basis and/or permanent basis. Memory 706 may be, for example, one or more random access memories (RAM) 714, cache memory 716, or any other suitable volatile or non-volatile storage device.

Program 600, organizational file 400, and from-to rules 500 are stored in persistent storage 708 for execution by one or more of the respective processors 704 via one or more memories of memory 706. In the embodiment illustrated in FIG. 7, persistent storage 708 includes flash memory. Alternatively, or in addition to, persistent storage 708 may include a magnetic disk storage device of an internal hard drive, a solid state drive, a semiconductor storage device, read-only memory (ROM), EPROM, or any other computer-readable tangible storage device that is capable of storing program instructions or digital information.

The media used by persistent storage 708 may also be removable. For example, a removable hard drive may be used for persistent storage 708. Other examples include an optical or magnetic disk that is inserted into a drive for transfer onto another storage device that is also a part of persistent storage 708, or other removable storage devices such as a thumb drive or smart card.

Communications unit 710, in these examples, provides for communications with other computers and devices. In these examples, communications unit 710 includes one or more network interface cards. Communications unit 710 may provide communications through the use of either or both physical and wireless communications links. In another embodiment still, computer system 700 may be devoid of communications unit 710. Program 600 may be downloaded to persistent storage 708 through communications unit 710.

I/O interface(s) 712 allows for input and output of data with other devices that may be connected to computer system 700. For example, I/O interface 712 may provide a connection to external devices 718 such as a keyboard, keypad, a touch screen, and/or some other suitable input device. I/O interface(s) may also connect to a display 720.

Display 720 provides a mechanism to display data to a user and may be, for example, a computer monitor.

The aforementioned program can be written in various programming languages (such as Java or C++) including low-level, high-level, object-oriented or non object-oriented languages. Alternatively, the functions of the aforementioned programs can be implemented in whole or in part by computer circuits and other hardware (not shown).

Based on the foregoing, a method, computer system, and computer program product have been disclosed for creating checking statements to validate interconnections between logic blocks in a circuit description. However, numerous modifications and substitutions can be made without deviating from the scope of the present invention. In this regard, each block in the flowcharts or block diagrams may represent a module, segment, or portion of code, which comprises one or more executable instructions for implementing the specified logical function(s). It should also be noted that, in some alternative implementations, the functions noted in each block may occur out of the order noted in the figures. Therefore, the present invention has been disclosed by way of example and not limitation.

What is claimed is:

1. A method for producing an interconnection checking statement for validating an interconnection between logic block instances, the method comprising the steps of:
   a computer receiving a description of a first logic block instance, a second logic block instance, and an association between the first logic block instance and the second logic block instance in a circuit design, wherein the first and second logic block instances are each selected from a plurality of logic block designs;
   the computer locating a rule statement associated with a first logic block design from the plurality of logic block designs and corresponding to the first logic block instance, the rule statement defining an output of at least a second logic block design, from the plurality of logic block designs, as a valid connection source to an input of the first logic block design;
   the computer determining whether the second logic block instance in the description connects to the first logic block instance in the description by examining the association between the first and second logic block instances;
   the computer determining whether the second logic block design corresponds to the second logic block instance; and
   responsive to determining that the second logic block instance connects to the first logic block instance and that the second logic block design corresponds to the second logic block instance, the computer creating an interconnection checking statement asserting an interconnection between an output of the second logic block instance corresponding to the output of the second logic block design, and an input of the first logic block instance corresponding to the input of the first logic block design.

2. The method of claim 1, wherein each of the plurality of logic block designs is a built-in self-test (BIST) logic description.

3. The method of claim 1, wherein the input of the first logic block design is an input pin and wherein the output of the second logic block design is an output pin.

4. The method of claim 1, wherein the input of the first logic block design is an input bus and wherein the output of the second logic block design is an output bus.

5. The method of claim 1, wherein the rule statement is selected from a plurality of rule statements specific to the first logic block design, and wherein each input of the first logic block design is represented by a rule statement from the plurality of rule statements defining at least one valid connection source for the input.

6. The method of claim 1, wherein the first logic block design and the second logic block design are the same logic block design from the plurality of logic block designs.

7. The method of claim 1, further comprising the step of the computer determining that the interconnection asserted between the output of the second logic block instance and the input of the first logic block instance by the interconnection checking statement is located in a logical representation of the circuit design.

8. A computer program product for producing an interconnection checking statement for validating an interconnection between logic block instances, the computer program product comprising:

one or more computer-readable tangible storage devices and program instructions stored on at least one of the one or more storage devices, the program instructions comprising:

program instructions to receive a description of a first logic block instance, a second logic block instance, and an association between the first logic block instance and the second logic block instance in a circuit design, wherein the first and second logic block instances are each selected from a plurality of logic block designs;

program instructions to locate a rule statement associated with a first logic block design from the plurality of logic block designs and corresponding to the first logic block instance, the rule statement defining an output of at least a second logic block design, from the plurality of logic block designs, as a valid connection source to an input of the first logic block design;

program instructions to determine whether the second logic block instance in the description connects to the first logic block instance in the description by examining the association between the first and second logic block instances;

program instructions to determine whether the second logic block design corresponds to the second logic block instance; and responsive to determining that the second logic block instance connects to the first logic block instance and that the second logic block design corresponds to the second logic block instance, program instructions to create an interconnection checking statement asserting an interconnection between an output of the second logic block instance corresponding to the output of the second logic block design, and an input of the first logic block instance corresponding to the input of the first logic block design.

9. The computer program product of claim 8, wherein each of the plurality of logic block designs is a built-in self-test (BIST) logic description.

10. The computer program product of claim 8, wherein the input of the first logic block design is an input pin and wherein the output of the second logic block design is an output pin.

11. The computer program product of claim 8, wherein the input of the first logic block design is an input bus and wherein the output of the second logic block design is an output bus.

12. The computer program product of claim 8, wherein the rule statement is selected from a plurality of rule statements specific to the first logic block design, and wherein each input of the first logic block design is represented by a rule statement from the plurality of rule statements defining at least one valid connection source for the input.

13. The computer program product of claim 8, wherein the first logic block design and the second logic block design are the same logic block design from the plurality of logic block designs.

14. The computer program product of claim 8, further comprising program instructions, stored on at least one of the one or more storage devices, to:

determine that the interconnection asserted between the output of the second logic block instance and the input of the first logic block instance by the interconnection checking statement is located in a logical representation of the circuit design.

15. A computer system for producing an interconnection checking statement for validating an interconnection between logic block instances, the computer system comprising:

one or more processors, one or more computer-readable tangible storage devices, and program instructions stored on at least one of the one or more storage devices for execution by at least one of the one or more processors, the program instructions comprising:

program instructions to receive a description of a first logic block instance, a second logic block instance, and an association between the first logic block instance and the second logic block instance in a circuit design, wherein the first and second logic block instances are each selected from a plurality of logic block designs;

program instructions to locate a rule statement associated with a first logic block design from the plurality of logic block designs and corresponding to the first logic block instance, the rule statement defining an output of at least a second logic block design, from the plurality of logic block designs, as a valid connection source to an input of the first logic block design;

program instructions to determine whether the second logic block instance in the description connects to the first logic block instance in the description by examining the association between the first and second logic block instances;

program instructions to determine whether the second logic block design corresponds to the second logic block instance; and responsive to determining that the second logic block instance connects to the first logic block instance and that the second logic block design corresponds to the second logic block instance, program instructions to create an interconnection checking statement asserting an interconnection between an output of the second logic block instance corresponding to the output of the second logic block design, and an input of the first logic block instance corresponding to the input of the first logic block design.

16. The computer system of claim 15, wherein each of the plurality of logic block designs is a built-in self-test (BIST) logic description.

17. The computer system of claim 15, wherein the input of the first logic block design is an input pin and wherein the output of the second logic block design is an output pin.

18. The computer system of claim 15, wherein the input of the first logic block design is an input bus and wherein the output of the second logic block design is an output bus.

19. The computer system of claim 15, wherein the rule statement is selected from a plurality of rule statements specific to the first logic block design, and wherein each input of the first logic block design is represented by a rule statement from the plurality of rule statements defining at least one valid connection source for the input.

20. The computer system of claim 15, further comprising program instructions, stored on at least one of the one or more storage devices for execution by at least one of the one or more processors, to:

determine that the interconnection asserted between the output of the second logic block instance and the input of the first logic block instance by the interconnection checking statement is located in a logical representation of the circuit design.

* * * * *